United States Patent [19]
Saito et al.

[11] Patent Number: 5,486,716
[45] Date of Patent: Jan. 23, 1996

[54] SEMICONDUCTOR INTEGRATED CIRCUIT DEVICE WITH ELECTROSTATIC DAMAGE PROTECTION

[75] Inventors: Yutaka Saito; Jun Osanai; Yoshikazu Kojima; Masaaki Kamiya, all of Tokyo, Japan

[73] Assignee: Seiko Instruments Inc., Japan

[21] Appl. No.: 880,720

[22] Filed: May 8, 1992

[30] Foreign Application Priority Data

May 14, 1991 [JP] Japan .................................. 3-109443
Jul. 16, 1991 [JP] Japan .................................. 3-175628
Jan. 21, 1992 [JP] Japan .................................. 4-008670

[51] Int. Cl.$^6$ .................................................. H01L 23/62
[52] U.S. Cl. .......................... 257/360; 257/355; 257/356; 257/357; 257/362
[58] Field of Search .................................. 257/355, 356, 257/357, 360, 361, 362

[56] References Cited

U.S. PATENT DOCUMENTS

| | | | |
|---|---|---|---|
| 3,777,216 | 12/1973 | Armstrong | 257/360 |
| 4,139,935 | 2/1979 | Bertin et al. | 257/361 |
| 4,602,267 | 7/1986 | Shirato | 257/360 |
| 4,616,243 | 10/1986 | Minato et al. | 257/357 |
| 4,691,217 | 9/1987 | Veno et al. | 257/360 |
| 4,725,915 | 2/1988 | Jwahashi et al. | 257/361 |
| 4,734,752 | 3/1988 | Liu et al. | 257/361 |
| 4,945,395 | 7/1990 | Suehiro | 257/357 |
| 4,989,057 | 1/1991 | Lu | 257/357 |
| 5,087,955 | 2/1992 | Futami | 257/355 |
| 5,140,401 | 8/1992 | Ker et al. | 257/357 |
| 5,173,755 | 12/1992 | Co et al. | 257/360 |
| 5,208,475 | 5/1993 | Mortensen | 257/360 |

FOREIGN PATENT DOCUMENTS

| | | | |
|---|---|---|---|
| 56-90555 | 7/1981 | Japan | 257/360 |
| 61-296773 | 12/1986 | Japan | 257/362 |
| 63-288066 | 11/1988 | Japan | 257/360 |

Primary Examiner—Steven H. Loke
Attorney, Agent, or Firm—Adams & Wilks

[57] ABSTRACT

A semiconductor integrated circuit device has a peripheral transistor having a strengthened ESD resistance for external connection. The peripheral transistor has a channel structure effective to release an electrostatic stress current more efficiently than an internal transistor of the semiconductor integrated circuit. In one embodiment, the peripheral transistor has a channel portion that is shorter than the channel portion of an internal transistor. In another embodiment, the peripheral transistor has a substrate contact, a ground line, and an additional resistor interconnection between them to efficiently release an electrostatic stress current. In another embodiment, the peripheral transistor has an asymmetric channel structure so that the distance between the source contact and the gate electrode is set shorter than the distance between the drain contact and the gate electrode. In another embodiment, the peripheral transistor has a drain region and a gate insulating film having a portion of the insulating film that is thinner than the rest of the gate insulating film. In another embodiment, a gate contact is electrically connected between a gate electrode and a metal gate line of the peripheral transistor to reduce a resistance therebetween. In another embodiment, the peripheral transistor has a transistor breakdown voltage that is smaller than a gate breakdown voltage to efficiently release electrostatic stress current.

10 Claims, 11 Drawing Sheets

FIG. 14A
X—X
CONV

FIG. 14B
Y—Y
LDD

SEMICONDUCTOR INTEGRATED CIRCUIT DEVICE WITH ELECTROSTATIC DAMAGE PROTECTION

BACKGROUND OF THE INVENTION

The present invention relates to a semiconductor integrated circuit device composed of transistors of the insulating gate field effect type, and more specifically relates to electrostatic damage protection structure of the transistors.

Figure 22:
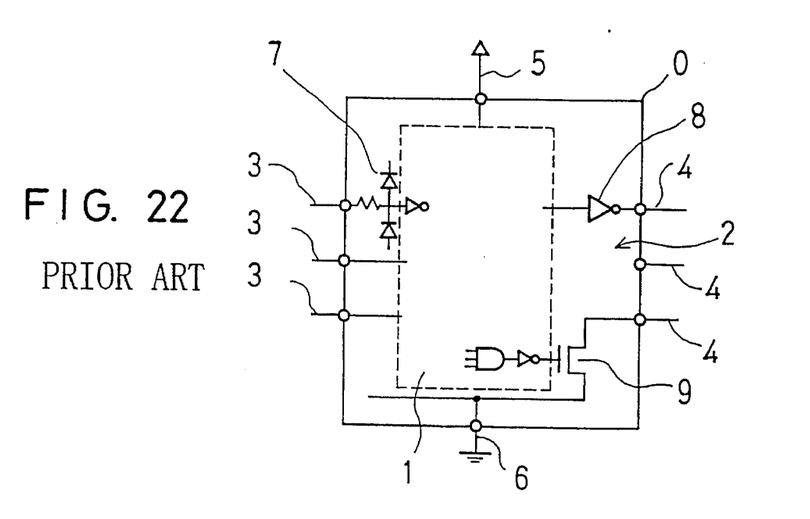
FIG. 22 is a schematic block diagram showing a general construction of the semiconductor integrated circuit device.

Referring to FIG. 22, a brief description is given for a typical construction of the conventional semiconductor integrated circuit device. The device 0 is composed of a peripheral connection area 2 for external connection and an internal circuit area 1 which performs certain logical processing and so on. These areas contain an integrated basic structural element composed of a metal-oxide-semiconductor transistor (hereinafter, referred to as "MOS transistor") of the field effect type. In order to facilitate the understanding of the description, a MOS transistor belonging to the peripheral connection area 2 is specifically referred to as a peripheral transistor, belonging to the internal circuit area 1 is referred to as an internal transistor.

The peripheral connection area 2 is provided with input terminals 3, output terminals 4, a power supply terminal 5, a ground terminal 6 and so on. Generally, an input protection circuit 7 is interposed between the input terminal 3 and the internal circuit area 1. The output terminals 4 are clasified into two groups. One group is called a CMOS output terminal utilizing an inverter 8 composed of a pair of complementary MOS transistors or a CMOS transistor pair. The other group is called an open-drain output terminal utilizing an N channel MOS transistor 9 which is connected in an open-drain manner. The CMOS transistor and the N channel transistor are exemplified as a peripheral transistor. Aside from these terminals, the power supply terminal 5 is connected to a power line VDD, and the ground terminal 6 is connected to a ground line GND.

Figure 23:
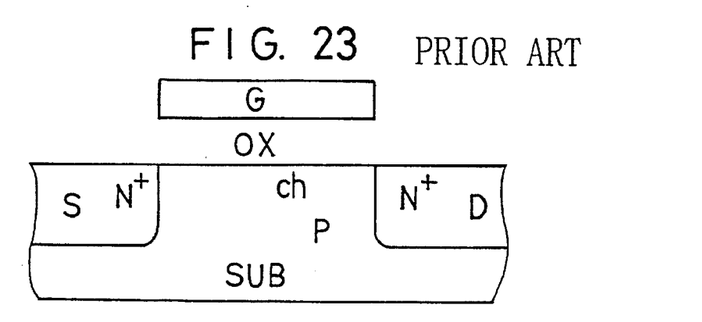
FIG. 23 is a sectional view showing the general CONV structure of an N channel MOS transistor.

Next referring to FIG. 23, brief description is given for the typical structure of the MOS transistor. The illustrated transistor is an N channel MOS transistor having a conventional $N^+$ single drain structure (hereinafter, referred to as "CONV structure"). A gate electrode G is formed on a semiconductor substrate SUB composed of silicon through a gate insulating film OX composed of silicon dioxide. The substrate SUB is a P type. The gate insulating film OX has a thickness on the order of 100–800Å. A pair of Source region S and drain region D are formed on opposite sides of the gate electrode G in the form of an $N^+$ type impurity diffusion region. A channel region ch is defined between the pair of diffusion regions. The conductivity of the channel region ch is controlled by the gate electrode G.

Recently, the size of the transistor element has been considerably reduced in order to increase an integration density of the semiconductor integrated circuit device. Namely, the length of the channel region ch (hereinafter, referred to as "channel length") is made shorter and shorter. However, if the channel length is extremely shortened in the CONV structure, there is frequently caused characteristic degradation due to hot electron damage.

Figure 24:
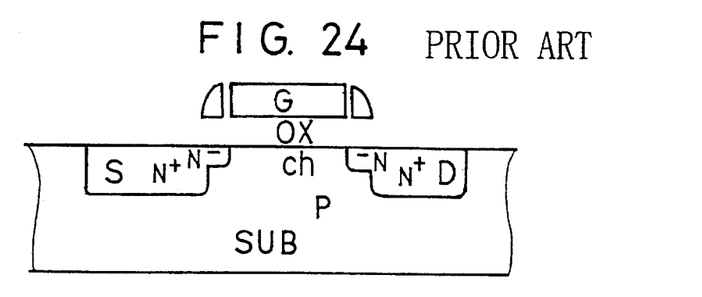
FIG. 24 is a sectional view showing the general LDD structure of an N channel MOS transistor.

Referring to FIG. 24, a brief description is given for a modified MOS transistor having a lightly doped drain structure (hereinafter, referred to as "LDD structure"). This LDD structure was developed in order to prevent degradation of durability due to hot electron damage, which becomes serious with the miniaturization of the transistor element. As shown in the figure, the LDD structure is provided with a drain region D composed of an $N^-$ type impurity diffusion region and a contiguous $N^+$ type impurity diffusion region. A source region S has the same contiguous diffusion region structure. According to a so-called scaling rule, the shorter the channel length, the thinner proportionally the thickness of the gate insulating film OX. For example, the thickness of the gate insulating film is about 300–400Å in the CONV structure, whereas the film thickness is reduced to 100–300Å in the micronized LDD structure. On the other hand, the CONV structure has a typical drain withstand voltage or breakdown voltage on the order of 10V, whereas the LDD structure can be adopted to raise the drain withstand voltage to over 20 V.

Figure 25:
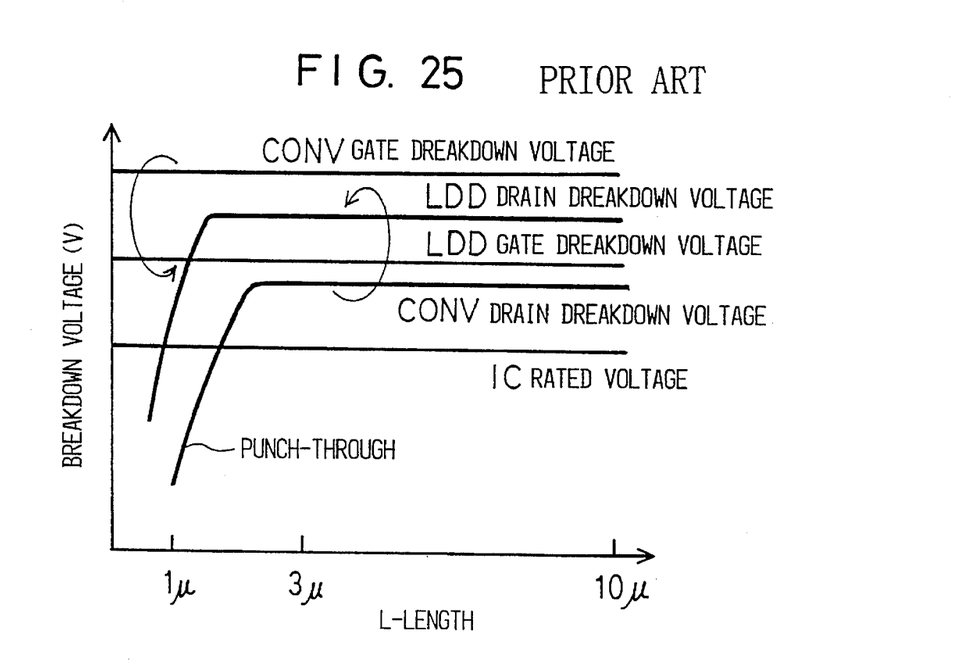
FIG. 25 is a graph showing the typical relation between the channel length and the breakdown voltage of the MOS transistor.

Referring to FIG. 25, a concise description is given for the problem of the prior art to be solved by the invention. FIG. 25 is a graph showing the relation between the transistor breakdown voltage and the channel length (hereinafter, occasionally referred to as "L-length"). As shown in the graph, the gate insulation withstand voltage or gate breakdown voltage of the miniaturized LDD structure is lower than that of the CONV structure, because the thickness of the gate insulating film is reduced in the LDD structure according to the scaling rule, as compared to the CONV structure. On the other hand, the drain breakdown voltage or DC withstand voltage is significantly raised as compared to the CONV structure. Further, a punch-through frequently occurs when the L-length is set below 3 μm in the CONV structure so that the drain breakdown voltage falls below a given IC rated voltage, whereas a punch-through is not observed as long as the L-length is set over 1 μm in the LDD structure.

As understood from the FIG. 25 graph, when the LDD structure is adopted to facilitate the miniaturization of the semiconductor device, there occurs an inversion phenomenon that the drain breakdown voltage exceeds the gate breakdown voltage. Consequently, there is caused the drawback that a resistance against electrostatic damage or destruction (hereinafter, referred to as "ESD resistance") of the MOS transistor is degradated adversely by the inversion phenomenon. Namely, when an external electrostatic stress is impressed on the drain electrode to flow a surge current, the stress is directly applied to the gate insulating film as the drain withstand voltage is raised by the LDD structure, thereby increasing a risk of the gate insulation destruction.

Referring back to FIG. 22, more detailed description is given for the drawback of the prior art. Conventionally, the internal transistors which constitute the internal circuit area 1 have substantially the same structure as the peripheral transistors which constitute the peripheral connection area 2 in view of the semiconductor fabrication process. In miniaturization of the semiconductor device, the first priority has been given to the improvement in durability against hot electron damage, while no practical countermeasure has been adopted with regard to the electrostatic damage. It is important for the internal transistor to prevent durability degradation due to hot electron damage or hot carrier damage in order to ensure operation reliability of the device. Further, reduction in the ESD resistance is not serious for the internal transistor because the same is not exposed directly to an external electrostatic stress. On the other hand, the peripheral transistor is directly affected by an external electrostatic stress, hence a poor ESD resistance would cause electrostatic destruction of the transistor to thereby disadvantageously generate defects. For example, the N channel MOS transistor 9 connected to the output terminal 4 of the open-drain type is particularly susceptible to electrostatic stress as compared to the output inverter 8 of the CMOS transistor pair, thereby causing serious problems.

SUMMARY OF THE INVENTION

In view of the problem of the prior art, an object of the present invention is to improve the ESD resistance of a peripheral transistor such as an N channel MOS transistor connected to the open-drain output terminal. In order to achieve the object of the invention, the semiconductor integrated circuit device is constructed basically such that the peripheral transistor has a channel structure effective to release an electrostatic stress current more efficiently as compared to the internal transistor. The channel structure includes not only the channel region itself but also the MOS configuration around the channel region.

BRIEF DESCRIPTION OF THE DRAWINGS

FIG. 26 C is a schematic circuit diagram showing a third application in which the inventive N channel peripheral transistor is connected to an input/output circuit as a protective element;

DETAILED DESCRIPTION OF THE INVENTION

Figure 1A:
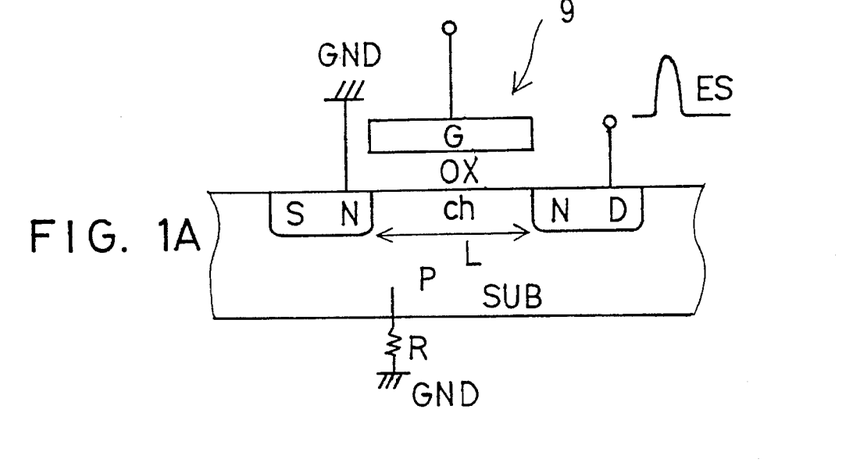
FIGS. 1A, 1B and 1C are schematic diagrams illustrating the basic structure and operation of a peripheral transistor provided in the semiconductor integrated circuit device.
Figure 1B:
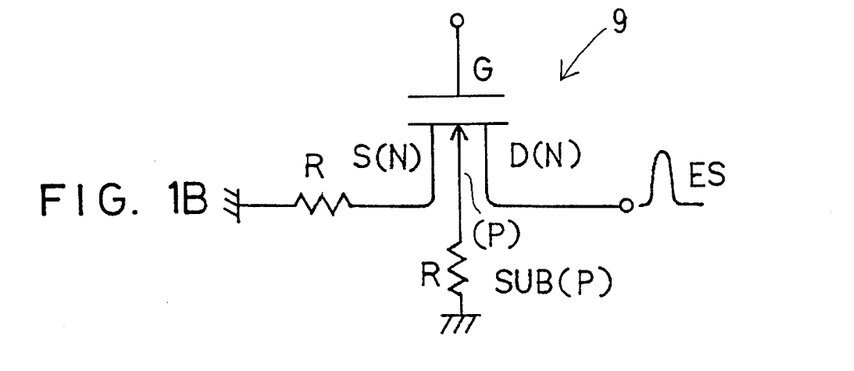
Figure 1C:
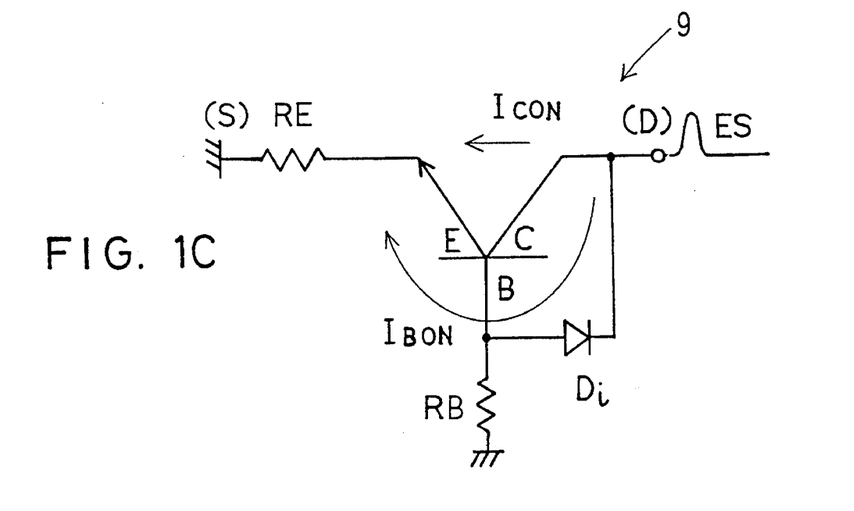

Referring to FIGS. 1A, 1B and 1C, concise description will be given firstly for the basic concept of the invention. FIG. 1A is a schematic section showing the structure of an N channel peripheral MOS transistor 9 connected to an open-drain output terminal of the inventive semiconductor integrated circuit device. A drain D is placed in an open state such that the drain D may incidentally receive an external electrostatic stress circuit ES. On the other hand, a source S of the transistor 9 is grounded, and a semiconductor substrate SUB is grounded also. Further, a gate electrode G receives a gate voltage from an internal circuit area (not shown) of the semiconductor integrated circuit device.

In order to improve the ESD resistance characteristic of the N channel MOS transistor 9, there are adopted five expedients of the channel structure. For the first expedient, the peripheral transistor 9 has a channel length L which is set shorter than a minimum channel length of internal transistors (not shown) while satisfying a given rated voltage of the device, thereby providing the channel structure effective to release the electrostatic stress current ES. In some case, the channel length L of the peripheral transistor 9 may be set equal to the minimum channel length of the internal transistors. The minimum channel length is determined according to the durability against hot electron damage. In view of this, the channel length of the peripheral transistor is set longer than a lower limit channel length around which the drain breakdown voltage of the transistor falls below the IC rated voltage, due to abrupt punch-through. Namely, it is not practical to reduce the channel length excessively. Preferably, the L-length of the peripheral transistor is partially reduced along a given widthwise section of the channel region. Stated otherwise, the peripheral transistor 9 may have an improved channel structure comprised of a first channel path having a regular channel length and a second channel path having a locally reduced channel length.

For the second expedient, the substrate SUB is electrically connected to a ground live GND of the device through an added resistor R. In addition to or in place of this connection structure, a substrate contact for the ground connection is positioned remotely from the drain region D of the peripheral transistor 9.

For the third expedient, the peripheral transistor 9 has an asymmetric channel structure such that a first distance between a contact point of the source S and the gate electrode G is set shorter than a second distance between another contact point of the drain D and the gate electrode G. Further, the substrate SUB may be preferably made of an epitaxial wafer.

For the fourth expedient, the peripheral transistor 9 has the CONV structure while the internal transistor (not shown in the figure) has the LDD structure. In addition to or in place of the fourth expedient, the peripheral transistor 9 has a gate insulating film OX having a partially reduced thickness along an edge portion of the drain region D. Further, the peripheral transistor 9 may have a surface impurity region which is formed at least partly along the edge portion of the drain region D and which has an impurity density greater than that of the substrate region SUB. Moreover, the peripheral transistor 9 may have the gate electrode G which is connected to a metal gate line through a gate contact formed just on top of the gate electrode G.

For the fifth expedient, the peripheral transistor may have a DSA structure of the impurity Diffusion Self-Alignment type.

Referring next to FIG. 1B, the detailed description is given for the operation of the invention. FIG. 1B shows an electrical connection of the open-drain N channel MOS transistor 9. The drain D is placed in the open state, while the source S is connected to the ground line GND through a resistance R. Further, the substrate SUB is connected to the ground line GND through another resistance R. As understood from the figure, N type of the drain D, P type of the substrate SUB and N type of the source S constitute together an NPN junction, which equivalently forms an NPN bipolar transistor.

FIG. 1C shows an electrical connection of the equivalent bipolar transistor. The NPN bipolar transistor has a collector C which corresponds to the drain D of the MOS transistor 9, a base B which corresponds to the substrate SUB of the transistor 9, and an emitter E which corresponds to the source S of the MOS transistor 9. A diode Di is connected between the collector C and the base B. This diode Di is formed of a PN junction between the drain region D and the substrate SUB. The collector C is held in the open state, while the base B is grounded through a base resistor RB and the emitter E is also grounded through an emitter resistor RE, thereby forming the emitter-follower connection. The base resistor RB and the emitter resistor RE correspond to the respective resistances R shown in FIG. 1B.

When the collector terminal in the open state receives a pulse of the electrostatic current ES or a surge current, a base current $I_{BON}$ flows into the base B of the bipolar transistor against a reverse breakdown voltage of the diode Di so that the bipolar transistor is turned on. Consequently, a collector current $I_{CON}$ directly flows between the collector C and the emitter E. By such operation, the electrostatic stress current ES is lead to the ground line GND to thereby prevent electrostatic destruction of the gate insulating film OX. This collector current $I_{CON}$ flows actually in the form a punch-through current or a surface breakdown current. As the electrostatic stress current ES is released easily, the ESD resistance of the peripheral transistor is improved.

As understood from FIG. 1C, firstly the conductance should be increased between the emitter E and the collector C in order to facilitate release of the electrostatic stress current ES. This means equivalently that the current amplification coefficient hFE should be increased in the bipolar transistor of the emitter-follower connection. The above noted first expedient is adopted for this purpose. For example, the channel length L of the peripheral transistor 9 is set shorter than that of the internal transistor in order to increase the channel conductance to flow a great amount of the collector current $I_{CON}$. The above mentioned fifth expedient is adopted for the same purpose. Namely, the peripheral transistor 9 is formed in the DSA structure to significantly reduce the channel length L.

Secondly, the base resistor RB should be set greater to facilite flow of the base current $I_{BON}$ such that the bipolar transistor is quickly turned on against the reverse breakdown voltage of the diode Di. As the bipolar transistor operation is switched on immediately, the ESD resistance is improved accordingly. The before-mentioned second expedient is adopted for this purpose. For example, the substrate contact of the peripheral transistor 9 is connected to the ground line GND through an added resistance R, thereby raising equivalently the base resistor RB.

Thirdly, the emitter resistor RE should be reduced as much as possible in order to facilitate flow of the collector current $I_{CON}$. The above noted third expedient is adopted for this purpose. For example, the asymmetric channel structure is adopted such that the first distance between the source contact and the gate electrode is set shorter than the second distance between the drain contact and the gate electrode, thereby equivalently reducing the emitter resistance RE.

Fourthly, the reverse breakdown voltage of the diode Di should be lowered to facilitate turning-on operation of the bipolar transistor to improve the ESD resistance. The above noted fourth expedient is adopted for this purpose. For example, the peripheral transistor is exceptionally formed in the CONV structure to lower the breakdown voltage of the drain, thereby reducing equivalently the reverse breakdown voltage of the diode Di.

As described above, the present invention is based on the fact that the peripheral MOS transistor carries out an equivalent bipolar action for the electrostatic stress current to remove the external stress. The inventive channel structure is adopted as described above to enable the quick and efficient bipolar action so as to significantly improve the ESD resistance.

Figure 2:
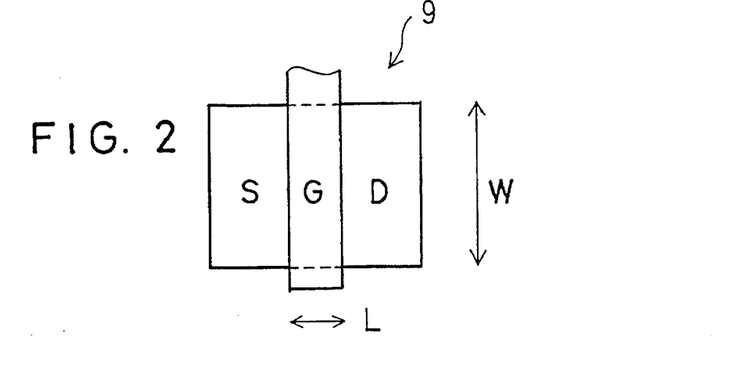
FIG. 2 is a schematic plan view showing a first embodiment of the inventive peripheral transistor.

Hereinafter, various preferred embodiments will be described in conjunction with the drawings. FIG. 2 is a plan view showing a first embodiment of the inventive peripheral transistor. In this embodiment, the peripheral transistor 9 has a channel length L which is set smaller than or equal to a minimum channel length of the internal transistor (not shown) while satisfying a given rated voltage of the semiconductor IC device. The internal transistors have variable channel lengths according to their required functions and operating characteristics. Accordingly, the channel length L of the peripheral transistor 9 should be set shorter than the minimum channel length of the internal transistors in order to raise the ESD resistance of the peripheral transistor 9 as compared to the internal transistor. However, the channel length must be set to satisfy the IC rated voltage. If the channel length L were shortened excessively, the DC breakdown voltage or the drain breakdown voltage would fall below the rated voltage.

The peripheral transistor 9 is formed of, for example, an N channel MOS transistor utilized for an open-drain output terminal. The channel length L of this transistor is reduced such that the N channel MOS transistor works as an NPN bipolar transistor having a relatively great conductance effective to improve the release capacity of the electrostatic stress. On the other hand, in the prior art a resistor is coupled to the open-drain output terminal in order to compensate for poor ESD resistance of the conventional peripheral transistor, hence hindering the driveability of the open-drain transistor. Thus, the channel width of the open-drain transistor must be increased to maintain its driveability in the prior art. In turn, since the ESD resistance is raised in this embodiment, no additional resistor is needed, nor is the channel width widened. Consequently, both of the channel length L and the channel width W are scaled down to thereby contribute to miniaturization of the peripheral transistors.

Figure 3:
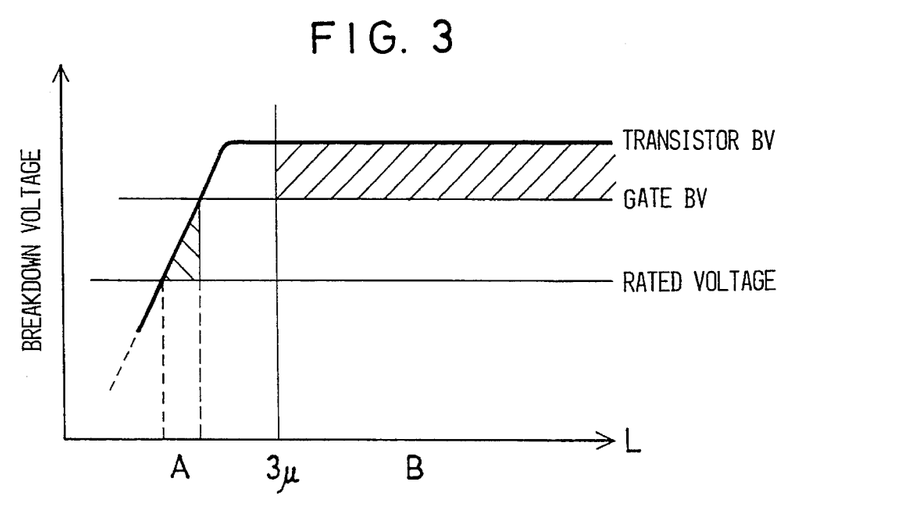
FIG. 3 is a diagram illustrating the operation of the first embodiment.

FIG. 3 is a graph showing the relation between the breakdown voltage and the L-length of the MOS transistor of the LDD structure, in which the drain breakdown voltage is raised. The transistor breakdown voltage exceeds the gate breakdown voltage in a range B where the L-length is set greater than 3 µm. The conventional peripheral transistor has the L-length set in the range B as well as the internal transistor. On the other hand, when the L-length is set below 2 µm, the transistor breakdown voltage falls to a punch-through range. In this invention, the L-length of the peripheral transistor is preferably set in a range A where the transistor breakdown voltage exceeds the rated voltage and is lower than the gate breakdown voltage. For example, the L-length is set in the range of 0.4–1.2 µm with respect to an IC device operable at 5 V of power voltage. The L-length is set in the range of 0.2–1.2 µm with respect to another IC device operable at 3 V of power voltage. As described above, the L-length is simply reduced to improve the ESD resistance even if the peripheral transistor has the LDD structure as well as the internal transistor. Accordingly in the FIG. 2 embodiment, the peripheral and internal transistors are fabricated by the same semiconductor process, thereby requiring no additional step.

Figure 4:
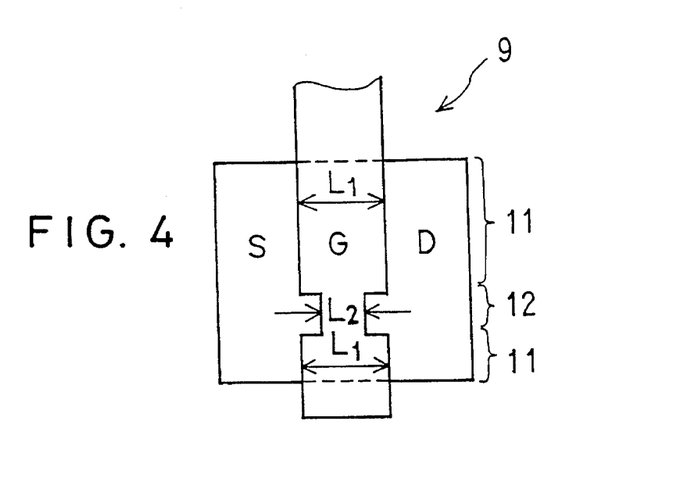
FIG. 4 is a schematic plan view showing a second embodiment of the inventive peripheral transistor.

FIG. 4 is a schematic plan view showing a second embodiment of the inventive peripheral transistor. The transistor 9 includes a first channel path 11 having a regular channel length $L_1$, and a second channel path 12 having a locally reduced channel length $L_2$. In contrast to the first embodiment shown in FIG. 2, the L-length is partially shortened in the present embodiment. Since the electrostatic stress has a relatively small amount of electric charges in spite of its high potential nature, the second channel path 12 can efficiently release the stress through its narrow channel section. On the other hand in normal operation, the second channel path 12 tends to frequently induce a punch-through as compared to the first channel path 11. However, the second embodiment has a specific advantage that a leak current due to punch-through can be limited to a relatively small amount since the second channel path 12 has a small widthwise dimension.

Figure 5:
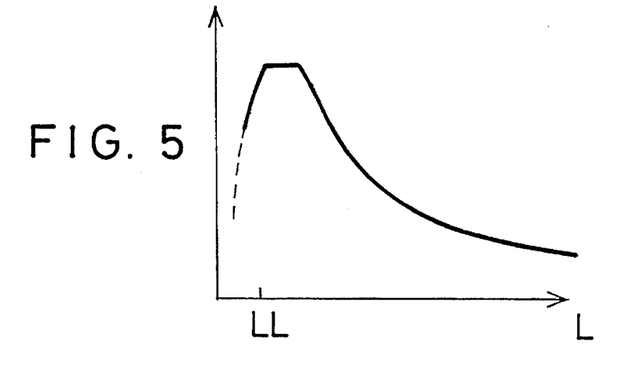
FIG. 5 is a graph showing the rotation between the channel length and the ESD resistance of the peripheral transistor.

FIG. 5 is a graph showing the relation between the ESD resistance and the L-length of the peripheral transistor. As understood from the graph, the smaller the L-length, the greater the ESD resistance. However, when the L-length falls below a given lower limit LL of the channel length, the ESD resistance is adversely reduced. For this, the L-length of the peripheral transistor should be set grater than the lower limit LL of the channel length. For example, the lower limit LL is on the order of 0.4 µm for an IC device operable at 5 V of power source voltage, and is in the order of 0.2 µm for an IC device operable at 3 V of power source voltage.

Figure 6:
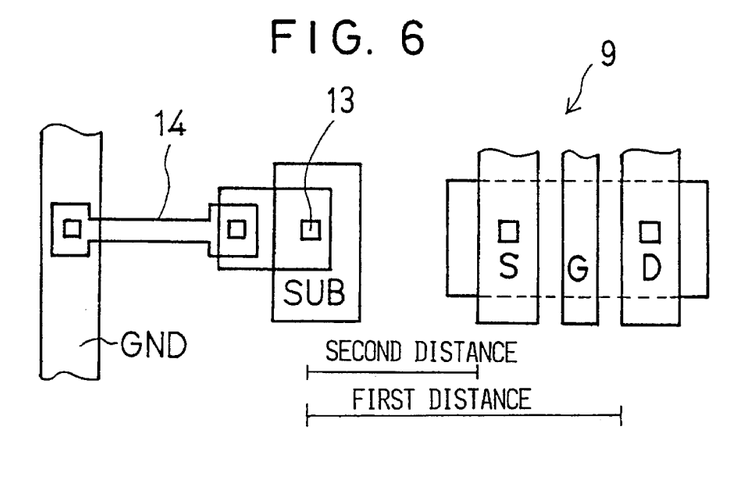
FIG. 6 is a schematic plan view showing a third embodiment of inventive peripheral transistor.

FIG. 6 is a schematic plan view showing a third embodiment of the inventive peripheral transistor. In this embodiment, the N channel MOS transistor 9 is connected to an open-drain output terminal. A substrate contact 13 for the ground connection is positioned remotely from a drain region D of the peripheral transistor 9. For example, the substrate contact 13 is disposed adjacently to the source region S of the peripheral transistor 9, such that the first distance between the substrate contact 13 and the drain region D is set greater than the second distance between the substrate contact 13 and the source region S. In addition, the substrate contact 13 is connected to the ground line GND through an added resistance 14. This resistance 14 can be formed of a patterned polysilicon film.

Figure 7:
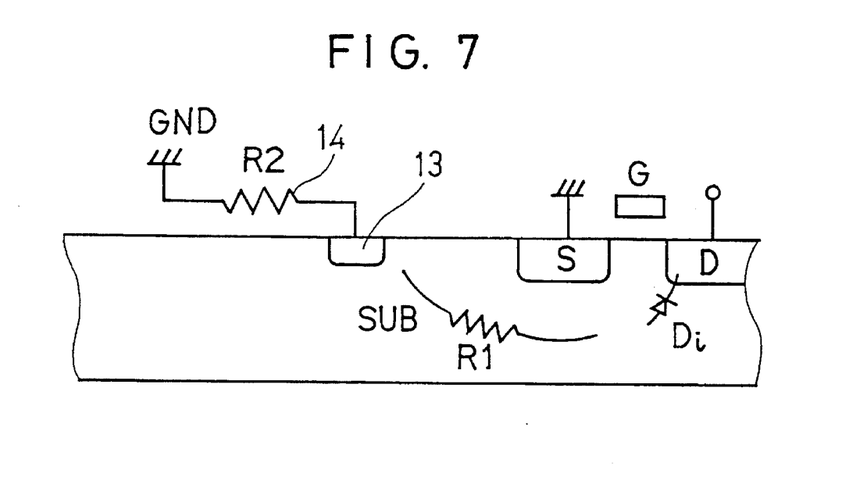
FIG. 7 is a schematic partial section showing the structure of the third embodiment.

FIG. 7 is a schematic sectional diagram of the third embodiment shown in FIG. 6. Since the substrate contact 13 is remote far from the drain region D, a relatively great resistance component $R_1$ is interposed therebetween through the substrate SUB. Further, another resistance component $R_2$ is interposed in the form of the added resistor 14 between the substrate contact 13 and the ground line GND. Consequently, the relatively great resistance components $R_1$ and $R_2$ are connected in series with each other between the drain region D and the ground line GND.

Figure 8:
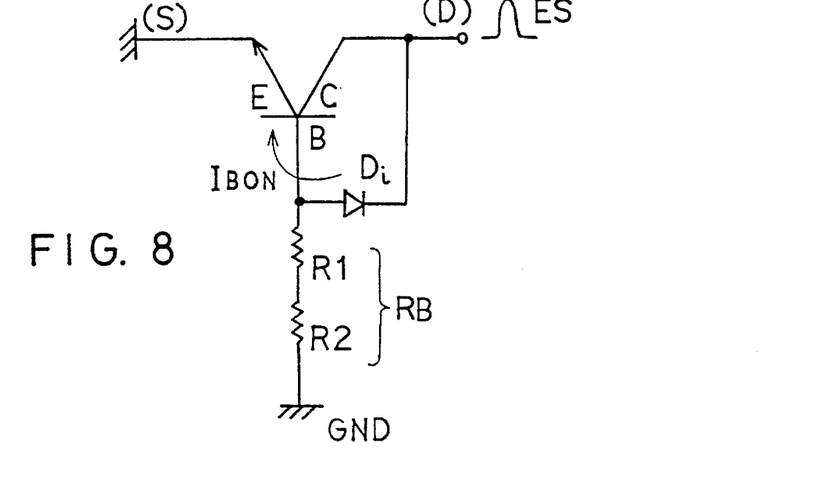
FIG. 8 is an equivalent circuit diagram illustrating the operation of the third embodiment.

FIG. 8 is an equivalent circuit diagram of an NPN bipolar transistor which corresponds to the FIG. 7 MOS transistor. As shown in the figure, a base resistor RB is interposed in the form of a serial connection of the resistance components $R_1$ and $R_2$ between the open collector C and the ground line GND of the base side through the diode Di. This base resistor RB has a great resistance value so as to easily turn on the NPN bipolar transistor to thereby improve the ESD resistance. Stated otherwise, the bipolar transistor can be turned on by a relatively small amount of the base current $I_{BON}$.

Figure 9:
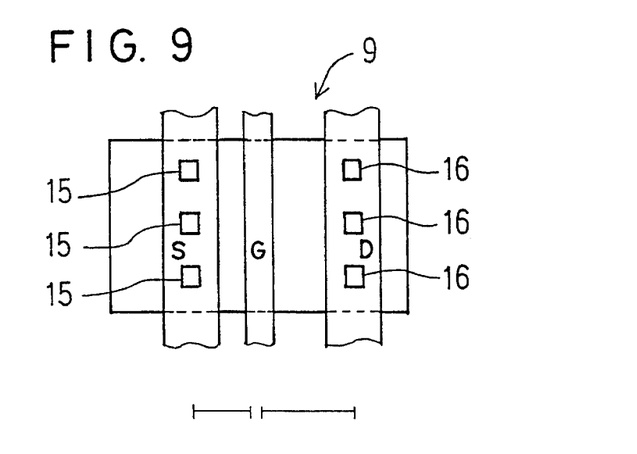
FIG. 9 is a plan view of a fourth embodiment of the inventive peripheral transistor.

FIG. 9 is a schematic plan view showing a fourth embodiment of the inventive peripheral transistor. In this embodiment, the peripheral transistor 9 has an asymmetric structure such that a distance between a source contact 15 and a gate electrode G is set smaller than another distance between a drain contact 16 and the gate electrode G. If the drain contact 16 were also disposed closely to the gate electrode G as well as to source contact 15, the ESD resistance would be adversely degradated.

Figure 10:
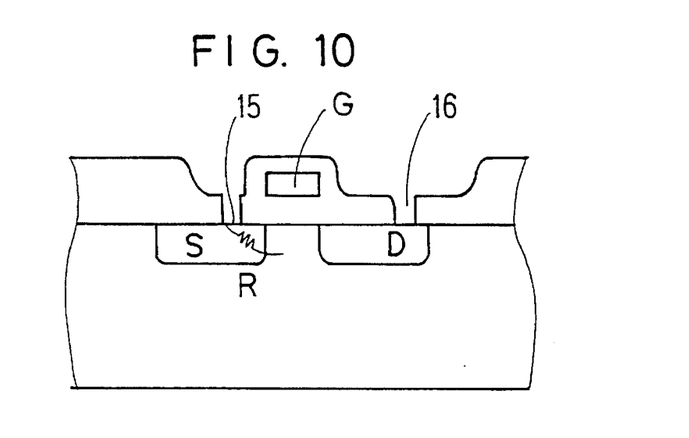
FIG. 10 is a schematic sectional view showing the structure of the fourth embodiment.

FIG. 10 shows a schematic sectional structure of the FIG. 9 embodiment. As shown in the figure, the distance is shortened between the gate electrode G and the source contact 15 so as to reduce an effective current path through the source region S to decrease a resistance component R.

Figure 11:
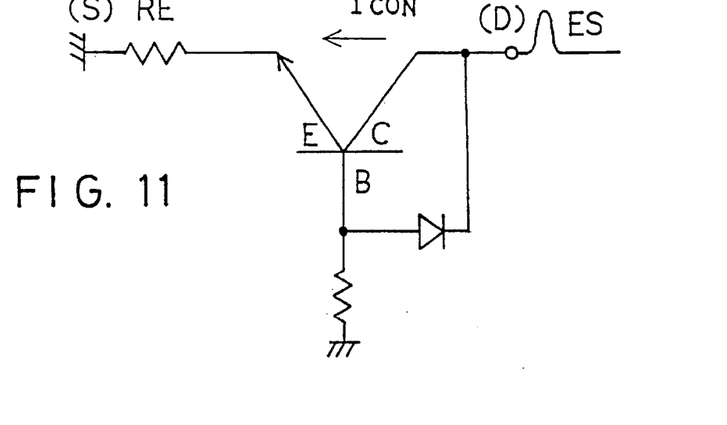
FIG. 11 is an equivalent circuit diagram illustrating the operation of the fourth embodiment.

FIG. 11 is an equivalent circuit diagram of an NPN bipolar transistor which represents functionally the FIG. 10 N channel MOS transistor of the open-drain type. As shown in the figure, an emitter resistor RE is interposed in the form of the resistance component R shown in FIG. 10 between the emitter E and the ground. This emitter resistor RE is controlled as small as possible in this embodiment in order to improve the conductance of the NPN transistor to assist in flow of the collector current $I_{CON}$ to thereby improve the ESD resistance.

Figure 12:
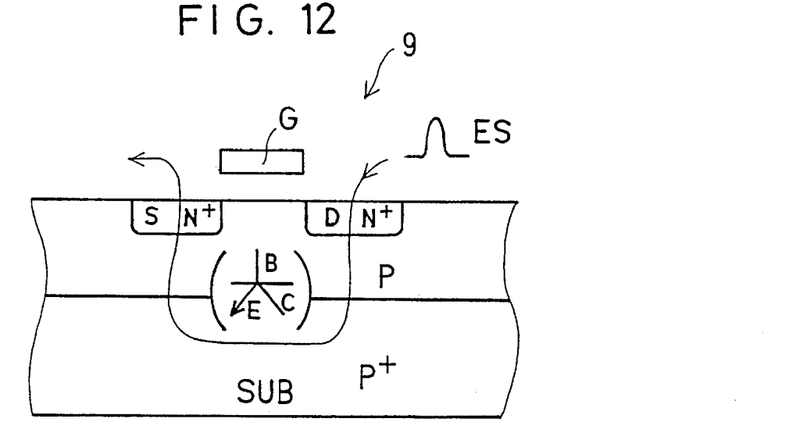
FIG. 12 is a schematic partial section showing a fifth embodiment of the inventive peripheral transistor.

FIG. 12 is a partial section of a fifth embodiment of the inventive semiconductor integrated circuit device. In this embodiment, the substrate SUB is composed of an epitaxial wafer. The peripheral transistor 9 is formed of an N channel MOS transistor on the wafer. The epitaxial wafer has a relatively high impurity density of $P^+$ type and therefore, it features a high electro-conductivity. The N channel MOS transistor is formed in the epitaxially grown surface layer of this wafer. By such construction, the electrostatic stress current ES applied to the open drain D is at least partly lead through the substrate SUB having the good conductivity to the source S. This means that the equivalent NPN bipolar transistor has an increased conductance between the emitter E and the collector C to thereby improve the ESD resistance of the peripheral transistor 9.

Figure 13:
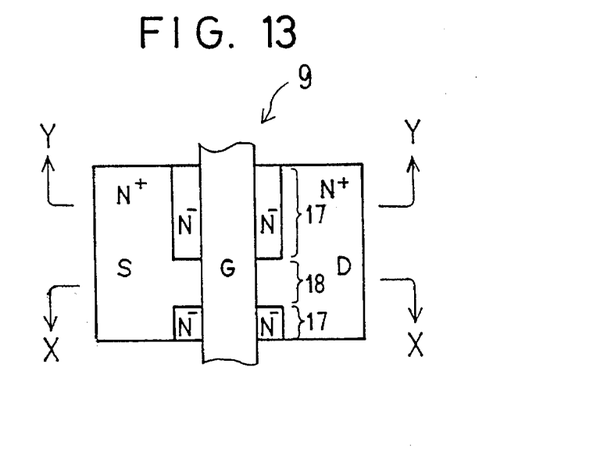
FIG. 13 is a schematic plan view showing a sixth embodiment of the inventive peripheral transistor.

FIG. 13 is a schematic plan view showing a sixth embodiment of the inventive peripheral transistor. In this embodiment, the peripheral transistor 9 has at least partly the CONV structure or a regular single drain structure, while an internal transistor (not shown in the figure) has the whole LDD structure or a double drain structure. As shown in the figure, a first widthwise channel section 17 has the LDD structure, and a second widthwise channel section 18 is formed selectively of the CONV structure. If the peripheral transistor is formed entirely of the CONV structure, the durability may be degraded by hot electron damage. In this embodiment, the CONV structure is limited locally so that the degradation by hot electron damage never extends through the entire widthwise channel region. The narrow channel path of the limited CONV structure can efficiently work since the amount of the electrostatic stress current is relatively small.

Figure 14A:
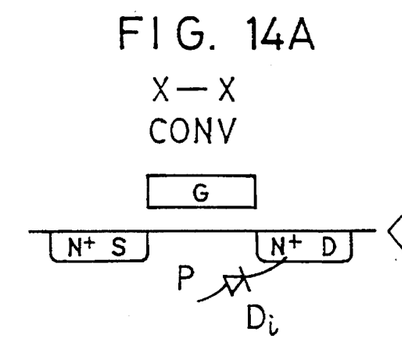
FIGS. 14A, 14B are partial sectional views showing the structure of the sixth embodiment.
Figure 14B:
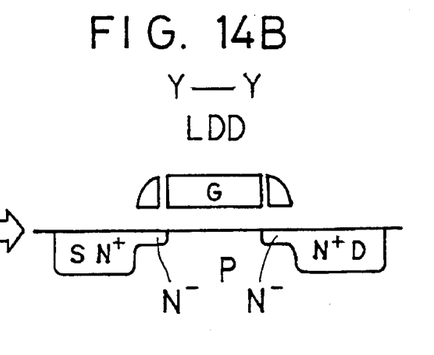

FIGS. 14A, 14B show different phases of sectional structure of the FIG. 13 embodiment. FIG. 14A illustrates the section of the CONV structure, taken along the line X—X of FIG. 13, and FIG. 14B illustrates the other section of the LDD structure, taken along the line Y—Y of FIG. 13. In the CONV structure section, the P type region of the substrate is contiguous to the $N^+$ type region of the drain D so that the diode Di of the $PN^+$ junction type has a relatively low breakdown voltage. On the other hand in the LDD structure section, the P type region of the substrate is contiguous to the $N^-$ region of the drain D so that the diode of the $PN^-$ junction type has a relatively high breakdown voltage.

Figure 15:
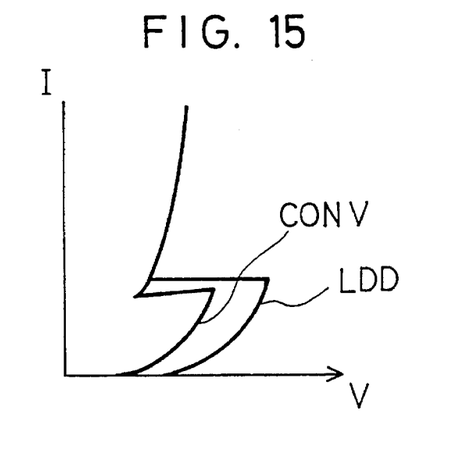
FIG. 15 is a graph showing the I-V characteristic curve of the sixth embodiment.

FIG. 15 is a graph showing the operation of the diode Di during the course of the release of the electrostatic stress. The $PN^+$ junction diode Di of the CONV structure can be turned on by a relatively low voltage to immediately provide an ON-current. On the other hand, the $PN^-$ junction diode Di of the LDD structure is turned on only by a relatively high voltage, and therefore it has a poor response for the electrostatic stress.

Figure 16:
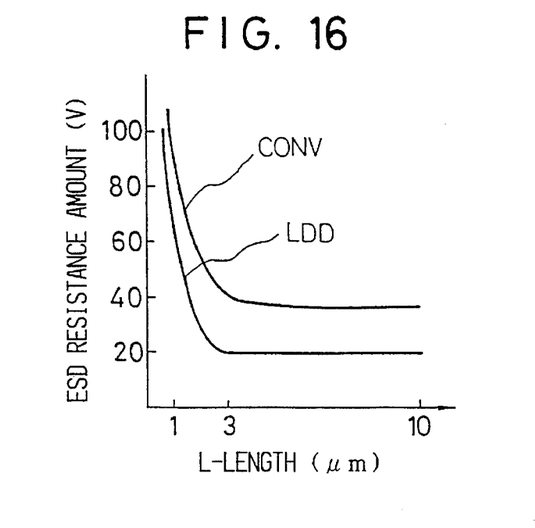
FIG. 16 is a graph showing the relation between the channel length and the ESD resistance of the peripheral transistor.
Figure 17:
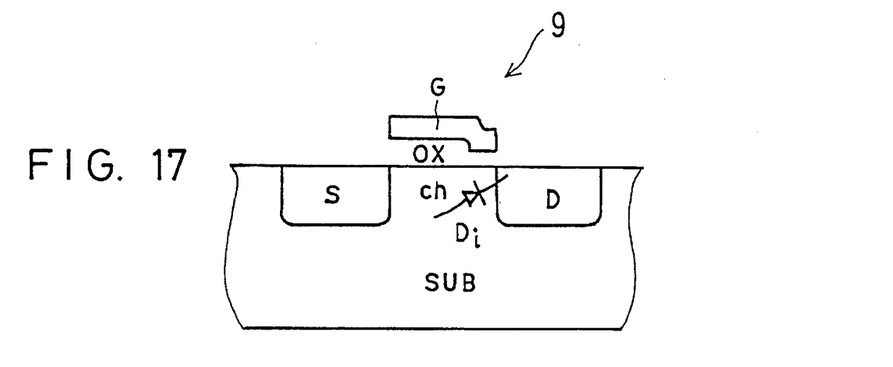
FIG. 17 is a schematic partial section of a seventh embodiment of the inventive peripheral transistor.

FIG. 16 is a graph showing the relation between the ESD resistance amount and the channel length based on measured results with respect to two different kinds of peripheral transistors having the whole CONV structure and the whole LDD structure. As seen from the graph, the MOS transistor of the CONV structure has an ESD resistance amount superior to the MOS transistor of the LDD structure without regard to the dimension of the channel length FIG. 17 is a schematic sectional view of a seventh embodiment of the inventive peripheral transistor. The peripheral transistor 9 features that the thickness of the gate insulating film OX is reduced at least along an edge portion of the drain region D. The reduction in the gate insulating film OX leads to lowering of the breakdown voltage of the PN junction diode Di formed under the reduced gate insulating film OX, whereby the equivalent bipolar transistor can be easily turned on. Stated otherwise, a surface breakdown current can be easily induced through the channel region ch to thereby improve the ESD resistance. The thickness of the gate insulating film OX may be reduced throughout the entire width of the channel region. However, it is preferable to reduce partially the gate insulating film thickness in order to prevent punch-through in the normal operation. This embodiment is particularly suitable for a semiconductor integrated circuit device or IC device operative at a power voltage equal to or less than 3 V, rather than the conventional IC device of 5 V standard operation type.

Figure 18:
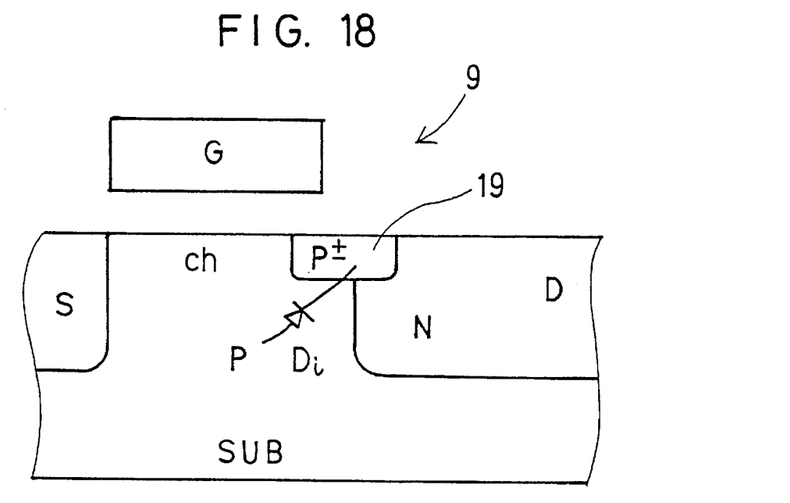
FIG. 18 is a schematic partial section of an eighth embodiment of the inventive peripheral transistor.

FIG. 18 is a schematic partial section of an eighth embodiment of the invention peripheral transistor. The peripheral transistor 9 features that a surface impurity region 19 having an impurity density higher than that of the substrate SUB is formed at least partially along an edge portion of the drain region D. For example, if the peripheral transistor is of the N channel type, their the drain D is composed of an N type impurity region and the substrate SUB forms a P type impurity region. The surface impurity region 19 is formed by impurity diffusion between the N type and P type impurity regions. By such construction, the breakdown voltage of the PN junction diode Di is decreased to thereby improve the ESD resistance of the transistor 9. Stated otherwise, a surface breakdown easily occurs along the channel ch such that the equivalent NPN bipolar transistor is easily turned on. It is preferable to form the surface impurity region 19 of the high impurity density locally along widthwise of the channel region in manner similar to the seventh embodiment. Further, the present embodiment is particularly suitable for a 3 V IC device of the relatively low voltage drive type. The impurity density of the surface impurity region 19 is preferably set moderately greater than that of the substrate SUB.

Figure 19:
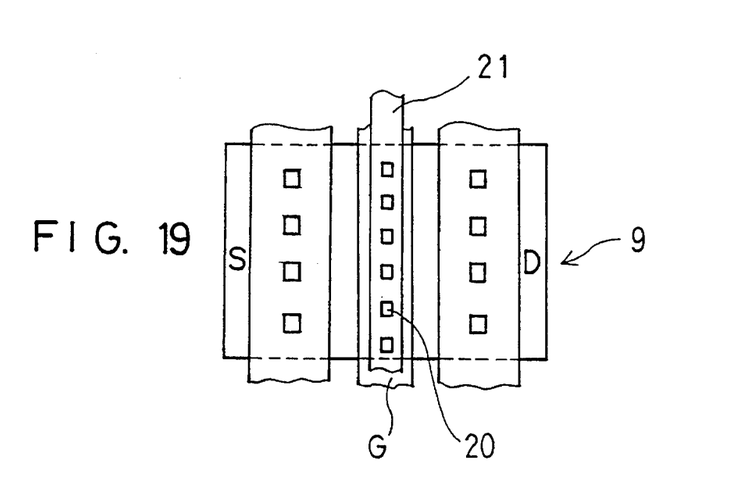
FIG. 19 is a schematic plan view of a ninth embodiment of the inventive peripheral transistor.

FIG. 19 is a schematic plan view of a ninth embodiment of the inventive peripheral transistor. The peripheral transistor 9 features that the gate electrode G is connected to a metal gate line 21 through a gate contact 20 formed just on top of the gate electrode G. By such construction, a resistance component can be reduced between the gate electrode G and the metal gate line 21 composed of, for example, aluminum, as compared to the prior art transistor.

Figure 20:
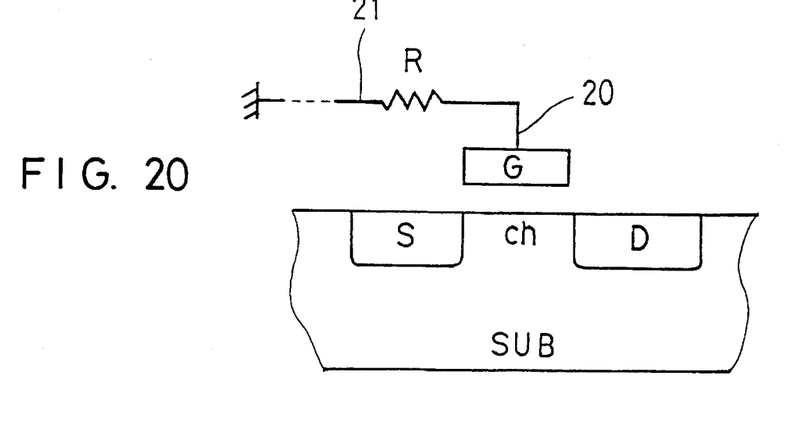
FIG. 20 is a schematic partial section showing the structure of the ninth embodiment.

FIG. 20 is a schematic sectional view of the FIG. 19 embodiment. The gate contact 20 disposed on top of the gate electrode G is directly connected to the metal gate line 21 disposed over the gate electrode G. Consequently, a value of the resistance R interposed therebetween can be reduced as compared to the prior art. By reducing the resistance component R, a potential of the gate electrode G can be controlled closely to the ground level, thereby advantageously facilitating occurrence of the surface breakdown in the channel ch.

Figure 21:
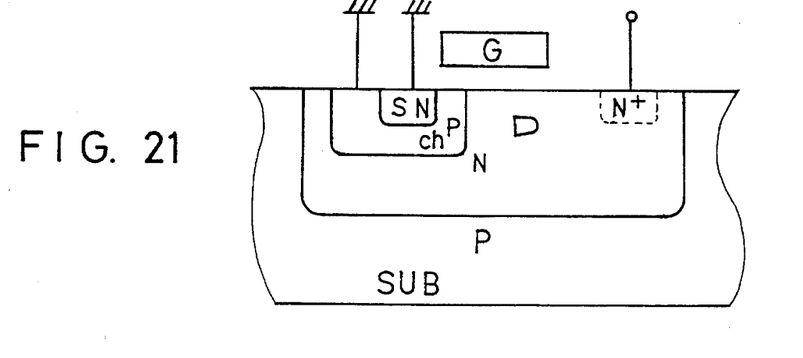
FIG. 21 is a schematic partial section illustrating a tenth embodiment of the inventive peripheral transistor.

Lastly, FIG. 21 is a schematic sectional view of a tenth embodiment of the inventive peripheral transistor. In this embodiment, the N channel MOS transistor 9 features 2N impurity "diffusion self-alignment" (DSA) type structure. As shown in the figure, in the DSA structure, N type and P type impurities are sequentially diffused into a P type substrate SUB in self-alignment manner to form the N type drain region D, the N type source region S and the P type channel region ch interposed therebetween. As understood from the figure, the channel region ch is formed in the thickness direction of the impurity diffusion layer in the DSA structure so as to reduce significantly the channel length. Consequently, the equivalent NPN bipolar transistor has a very high channel conductance.

Figure 26A:
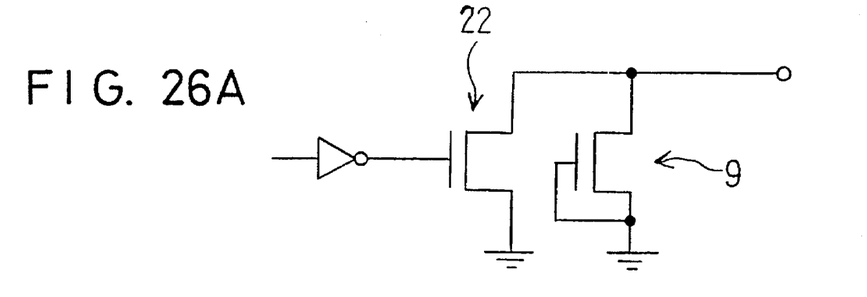
FIG. 26 is a schematic circuit diagram showing a first application in which the inventive peripheral N channel MOS transistor is connected to an N channel open-drain output terminal as a protective element.

In the above described various embodiments, the peripheral transistor is utilized as an open-drain terminal of the semiconductor integrated circuit device. Hereinafter, other applications will be described. FIG. 26A is a schematic circuit diagram showing a first application is which an N channel MOS transistor 9 is placed in an OFF state connection such that its gate is connected to its source (hereinafter, this connection is referred to as "OFF connection"), and its drain is connected to an open-drain terminal of another peripheral N channel MOS output transistor 22. In the before-mentioned embodiments, the peripheral MOS transistor constitutes the open-drain output terminal itself. In turn, in this application, the added peripheral transistor 9 is effective as a protective element when the open-drain output transistor 22 cannot flow a much electric current $I_{DS}$ in the conductive state. Namely, when the channel length is reduced as in the first embodiment, the conductance gm of the MOS transistor is raised automatically. Even when the channel length is shortened partly as in the second embodiment, the conductance gm increases along the shortened path of the channel region. In this application, the N channel MOS transistor 9 having the shortened channel length is always held in the OFF state to thereby completely avoid the noted drawback. An external electrostatic stress is released through the N channel MOS transistor 9 to thereby improve the ESD resistance as a whole of the output circuit including the output transistor 22. A lead current may flow from the N channel MOS transistor 9 of the OFF connection through the shortened channel path. However, the width of the shortened channel path can be limited as in the second embodiment to thereby practically avoid such a leak problem. The present application can adopt any transistor of the first to tenth embodiments. In this application, the inventive peripheral N channel MOS transistor 9 is added in the form of the OFF connection as a buffer or a protective element.

Figure 26B:
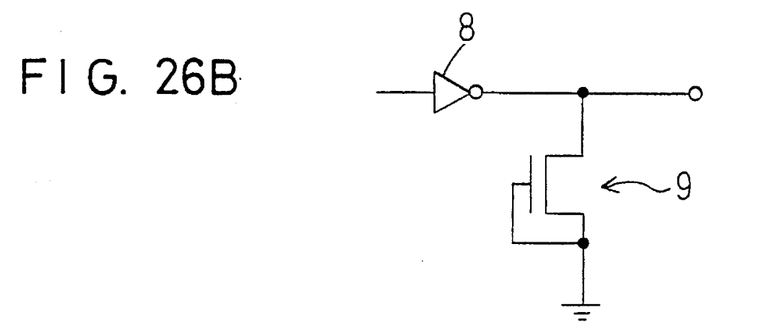
FIG. 26B is a schematic circuit diagram showing a second application in which the inventive peripheral N channel MOS transistor is connected to a CMOS inverter output terminal as a protective element.

FIG. 26B is a schematic circuit diagram showing a second application in which the N channel MOS transistor 9 of the OFF connection is added as a protective element to an output terminal of the CMOS inverter 8. The present application achieves the same effect as the first application.

Figure 26C:
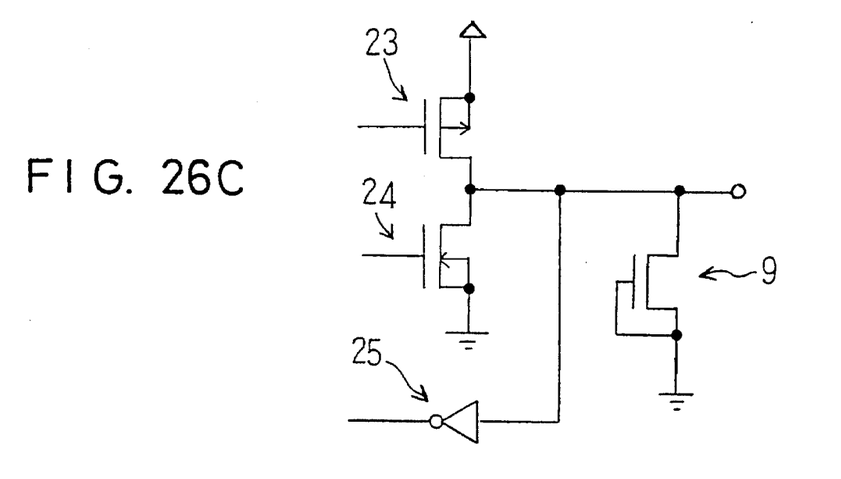

FIG. 26C is a schematic circuit diagram showing a third application in which the inventive N channel MOS transistor 9 of the OFF connection in connected as a protective element to an input/output terminal comprised of a P channel output transistor 23, an N channel output transistor 24 and an input inverter 25. This application can achieve the same effect as the first application. Moreover, there can be obtained a sufficient ESD resistance without an addition of a resistor for electrostatic stress protection to the input inverter 25.

Figure 27A:
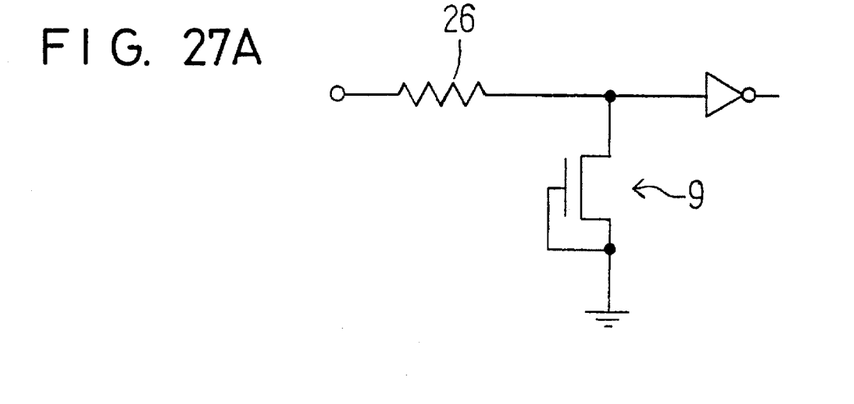
FIG. 27A is a schematic circuit diagram showing a fourth application in which the inventive N channel peripheral transistor is added as a protective element to an input terminal of the semiconductor device.
Figure 27B:
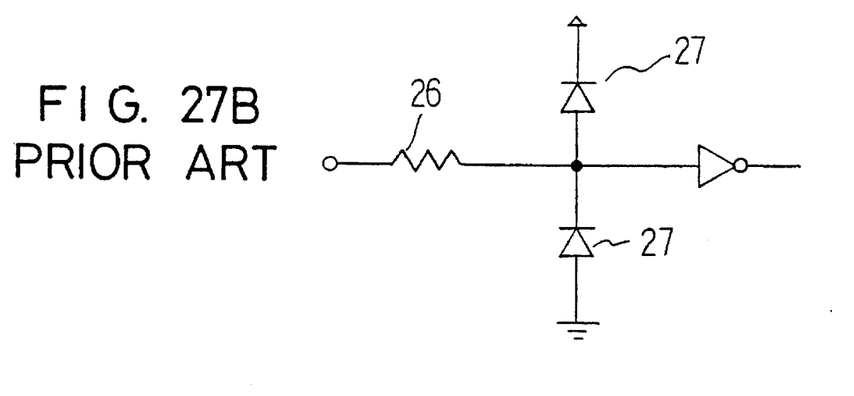
FIG. 27B is a circuit diagram showing the conventional input protection circuit.

FIG. 27A is a schematic circuit diagram showing a fourth application in which the inventive N channel MOS transistor 9 of the OFF connection is added as a protective element to an input terminal composed of an input protection resistor 26 and an input inverter. For comparison, FIG. 27B shows the conventional input protection circuit in which an input protection resistor 26 has a relatively high order of electric resistance in the range of several kΩ—several tens kΩ so as to ensure a practical ESD resistance. On the other hand, the N channel MOS transistor 9 is added in this application so that the resistance value of the input protection resistor 26 is lowered below several kΩ or even the input protection resistor may be eliminated while sufficient ESD resistance can be secured effectively. Particularly, this application is advantageous when used for a specific semiconductor integrated circuit device of which is required a fast response. A protection resistor is eliminated from an input terminal of the fast response device so as to avoid a delay due to a CR constant of the input resistance.

Figure 28:
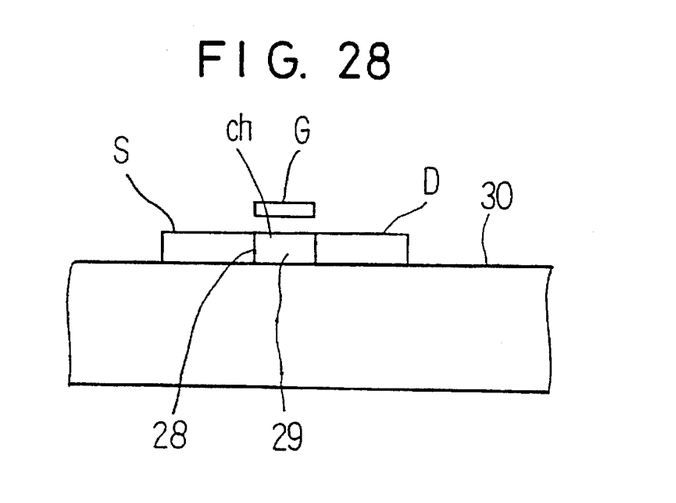
FIG. 28 is a schematic sectional view showing the inventive thin film transistor device formed on an insulating layer.

Recently, the semiconductor integrated circuit device has been further miniaturized to achieve higher integration density and higher operation speed. In order to realize further improvement in the operation speed, a junction capacity must be reduced between the source region S and drain region D of the MOS transistor, and the substrate SUB. In view of this, there has been developed a thin film transistor. FIG. 28 is a schematic sectional view of the thin film transistor formed on an insulating layer. This type of the thin film transistor is called a TFT transistor or SOI transistor. As seen from FIG. 28, a bottom of the source S and drain D is not contacted with a substrate SUB 29 formed of a semiconductor thin film, but is contacted with an insulating layer 30 so as to reduced the junction capacity. Further, the channel region ch is formed of almost all of the thickness portion of the substrate SUB 29. Thus, the substrate SUB 29 cannot be held at a given potential level. The PN junction 28 has a limited area far smaller than that of the conventional MOS transistor. Therefore, the SOI transistor itself has a relatively poor ESD resistance. The ESD resistance cannot be improved by the conventional protection circuit such as shown in FIG. 27B which utilized a pair of protection diodes 27. The inventive N channel MOS transistor can be used effectively in input and output terminals of the semiconductor integrated circuit device comprised of SOI transistors, in a manner similar to the first to fourth applications of the invention. This is the fifth application of the invention. The N channel MOS transistor is formed of any of the first to tenth embodiments. The present invention can be applied not only to input/output terminals, but also to a power supply line of the MOS transistor device and to an internal circuit of the MOS transistor device.

As described above, according to the invention, in the semiconductor integrated circuit device which is comprised of a peripheral connection area containing a peripheral transistor of the insulating gate field effect type for an external connection and an internal circuit area containing an internal transistor of the insulating gate field effect type, the peripheral transistor has a channel structure effective to release an electrostatic stress current more efficiently than the internal transistor, thereby advantageously increasing the ESD resistance of the peripheral transistor higher than the internal transistor. Generally, the peripheral transistor is directly affected by an electrostatic stress in contact to the internal transistor. The ESD resistance of the peripheral transistor is raised to thereby advantageously improve the entire reliability of the semiconductor integrated circuit device. Further, according to the invention, while the ESD resistance of the peripheral transistor is selectively improved, the internal transistor is not subjected to structural and operational changes. Thus, the internal transistor can held good durability against hot electron damage etc.

What is claimed is:

1. A semiconductor integrated circuit device, comprising: an internal circuit area including an internal transistor of an insulating gate field effect type, the internal transistor having a channel portion formed with a length limited by a predetermined minimum length value; and a peripheral connection area including an N channel type peripheral transistor of the insulating gate field effect type for use in an external connection, an open-drain output portion and an open-drain output transistor electrically connected to the open-drain output portion, wherein the peripheral transistor is electrically connected to the open-drain output transistor and has a short channel portion formed with a shorter length than the predetermined minimum length value so that an electrostatic stress current applied to the semiconductor integrated circuit is released more efficiently by the peripheral transistor than by the internal transistor.

2. A semiconductor integrated circuit device, comprising: an internal circuit area including an internal transistor of an insulating gate field effect type, the internal transistor having a channel portion formed with a length limited by a predetermined minimum length value; and a peripheral connection area including an N channel type peripheral transistor of the insulating gate field effect type for use in an external connection, and a CMOS transistor output portion electrically connected to the peripheral transistor, the peripheral transistor having a short channel portion formed with a shorter length than the predetermined minimum length value so that an electrostatic stress current applied to the semiconductor integrated circuit is released more efficiently by the peripheral transistor than by the internal transistor.

3. A semiconductor integrated circuit device, comprising: an internal circuit area including an internal transistor of an insulating gate field effect type; and a peripheral connection area including a peripheral transistor of the insulating gate field effect type for use in an external connection, an open-drain output portion and an open-drain output transistor electrically connected to the open-drain output portion, wherein the peripheral transistor has a drain region, a source region, a ground line, and a substrate contact, and the substrate contact being disposed more remote from the drain region than from the source region for electrical connection to the ground line and the peripheral transistor is electrically connected to the open-drain output transistor so that an electrostatic stress current applied to the semiconductor integrated circuit is released more efficiently by the peripheral transistor than by the internal transistor.

4. A semiconductor integrated circuit device, comprising: an internal circuit area including an internal transistor of an insulating gate field effect type; and a peripheral connection area including a peripheral transistor of the insulating gate field effect type for use in an external connection, the peripheral transistor having an asymmetric channel structure having a source contact, a drain contact and a gate electrode such that a distance between the source contact and the gate electrode is set shorter than a distance between the drain contact and the gate electrode so that an electrostatic stress current applied to the semiconductor integrated circuit is released more efficiently by the peripheral transistor than by the internal transistor.

5. A semiconductor integrated circuit device, comprising: an internal circuit area including an internal transistor of an insulating gate field effect type; and a peripheral connection area including an open-drain output portion, an open-drain output transistor electrically connected to the open-drain output portion, and an N channel type peripheral transistor of the insulating gate field effect type for use in an external connection, the peripheral transistor having a drain region, and a gate insulating film having a portion near an edge portion of the drain region being thinner than the rest of the gate insulating film and the peripheral transistor is electrically connected to the open-drain output transistor so that an electrostatic stress current applied to the semiconductor integrated circuit is released more efficiently by the peripheral transistor than by the internal transistor.

6. A semiconductor integrated circuit device, comprising: an internal circuit area including an internal transistor of an insulating gate field effect type; and a peripheral connection area including an N channel type peripheral transistor of the insulating gate field effect type for use in an external connection, the peripheral transistor having a drain region, and a gate insulating film having a portion near an edge portion of the drain region being thinner than the rest of the gate insulating film, the peripheral connection area further including a CMOS transistor output portion electrically connected to the peripheral transistor so that an electrostatic stress current applied to the semiconductor integrated circuit is released more efficiently by the peripheral transistor than by the internal transistor.

7. A semiconductor integrated circuit device, comprising: an internal circuit area including an internal transistor of an insulating gate field effect type; and a peripheral connection area including a peripheral transistor of the insulating gate field effect type for use in an external connection, an open-drain output portion and an open-drain output transistor electrically connected to the open-drain output portion, wherein the peripheral transistor is electrically connected to the open-drain output portion and the peripheral transistor has a gate electrode, a metal gate line, and a gate contact, the gate contact being electrically connected between the gate electrode and the metal gate line to reduce a resistance therebetween so that an electrostatic stress current applied to the semiconductor integrated circuit is released more efficiently by the peripheral transistor than by the internal transistor.

8. A semiconductor integrated circuit device, comprising: an internal circuit area including an internal transistor of an insulating gate field effect type; and a peripheral connection area including an external connection portion and a peripheral transistor of the insulating gate field effect type electrically connected to the external connection portion, the peripheral transistor having an impurity diffusion self-alignment type channel structure having a drain region, a source region and a channel region interposed therebetween, the source region being electrically grounded, the drain region being formed around both the channel region and the source region in a semiconductor substrate and being electrically connected to the external connection portion so that an electrostatic stress current applied to the semiconductor integrated circuit is released more efficiently by the peripheral transistor than by the internal transistor.

9. A semiconductor integrated circuit device, comprising: an internal circuit area including an internal transistor of an insulating gate field effect type; and a peripheral connection area including a peripheral transistor of the insulating gate field effect type for use in an external connection, and a CMOS transistor output portion electrically connected to the peripheral transistor, the peripheral transistor having a gate electrode, a metal gate line, and a gate contact, the gate contact being electrically connected between the gate electrode and the metal gate line to reduce a resistance therebetween so that an electrostatic stress current applied to the semiconductor integrated circuit is released more efficiently by the peripheral transistor than by the internal transistor.

10. A semiconductor integrated circuit device, comprising: an internal circuit area including a thin film internal transistor of an insulating gate field effect type formed on an insulating layer; and a peripheral connection area including a peripheral transistor of the insulating gate field effect type formed on an insulating layer, the peripheral connection area also including a CMOS transistor output portion electrically connected to the peripheral transistor so that an electrostatic stress current applied to the semiconductor integrated circuit is released more efficiently by the peripheral transistor than by the internal transistor.

\* \* \* \* \*